United States Patent
Janssen et al.

(10) Patent No.: US 6,414,511 B1
(45) Date of Patent: Jul. 2, 2002

(54) ARRANGEMENT FOR TRANSIENT-CURRENT TESTING OF A DIGITAL ELECTRONIC CMOS CIRCUIT

(75) Inventors: Petrus J. M. Janssen; Cornelis M. Hart, both of Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/498,880

(22) Filed: Feb. 7, 2000

(30) Foreign Application Priority Data

Feb. 10, 1999 (EP) .............................. 99200367

(51) Int. Cl.[7] .................... G01R 31/26; G01R 27/04; G01V 3/02
(52) U.S. Cl. .................. 324/769; 324/767; 324/357; 324/643
(58) Field of Search ................ 324/618, 601, 324/769, 643, 767, 357; 257/369; 702/107

(56) References Cited

U.S. PATENT DOCUMENTS

| 4,090,132 A | * | 5/1978 | Alexander ............ 73/1.36 |
| 4,888,987 A | * | 12/1989 | Zhang ................. 73/204.14 |
| 5,010,377 A | * | 4/1991 | Beasom ................ 257/274 |
| 5,940,782 A | * | 8/1999 | Gottshall et al. ........ 702/107 |
| 6,114,855 A | * | 9/2000 | Petrovich et al. ....... 324/357 |
| 6,167,349 A | * | 12/2000 | Alvarez ................ 702/63 |

OTHER PUBLICATIONS

Sachdev Manoj et al: "Defect Detection with Transient Current Testing and its Potential for Deep Sub–Micron CMOS ICS" International Test Conference, US, New York, NY: IEEE, vol. CONF. 29, 1998, pp. 204–213.

"Device Test Method Using Power Supply Current Signature Comparison" IBM Technical Disclosure Bulletin, US, IBM Corp. New York, vol. 34, No. 4A Sep. 1, 1991, pp. 253–255.

* cited by examiner

Primary Examiner—N. Le
Assistant Examiner—Wasseem H. Hamdan

(57) ABSTRACT

For transient-current testing of an electronic circuit, a differentiating current measuring device is arranged for measuring an undershoot voltage for each of a series of current pulses controlled in the circuit. In particular, the device is executed in integrated circuit technology and simulates a differentiating current probe. Furthermore, it may have calibration for imparting an offset voltage to each undershoot voltage of the series. This calibrates an actual potential of the simulation and produces for a correct Device Under Test in each cycle a substantially uniform undershoot voltage.

12 Claims, 6 Drawing Sheets

ARRANGEMENT FOR TRANSIENT-CURRENT TESTING OF A DIGITAL ELECTRONIC CMOS CIRCUIT

BACKGROUND OF THE INVENTION

The invention relates to a system for transient-current testing of an electronic circuit. Generally, transient-current measurements or so-called IDDT ($I_{dd}T$) measurements have found application for effecting structural testing on digital integrated circuits that feature relatively larger leakage currents at decreasing circuit detail size. IDDT testing has been proposed as an alternative or supplement to quiescent-current, or IDDQ, testing, because some circuits may not be IDDQ testable with continuous measurements through their having pull-ups or other aspects. Also, spread in leakage may increase. As would be obvious, such testing should in general find the best possible compromise between spotting all sub-standard circuits and rejecting zero correct operating circuits as based on one or more parameters that have some non-ideal mapping from functionality. Moreover, it should be preferable when only a single test principle were necessary. A relevant IDDT-methodology has been published in M. Sachdev, P. Janssen and V. Zieren, "Defect Detection with Transient Current Testing and its Potential for Deep Sub-micron CMOS IC's" Proc. Int. Test Conf. 1998, pp. 204–213. Now, although the above teaching is fully adequate from a theoretical point of view, practicing thereof has run into various difficulties as relating to flexibility, test apparatus cost and in particular, integratability, in that it requires for mixed signal -analog plus digital-facilities. Such difficulties stem from one or more of the following causes:

- the reference uses a current probe that is less than optimum from a flexibility point of view;
- the reference compares in software with a so-called "golden device" of known and adequate functionality; such approach often requires an inappropriate amount of time because many digital testers have little or no local computing facilities.

Now, according to the present invention, the simulating of a current probe by a high-pass filter has allowed appreciable freedom in choosing the 3-dB filter point, which in turn has facilitated integrating into an integrated test circuit. The new approach also allows to implement a calibration feature, which in turn enables to use only a digital tester enhanced with ADC and DAC but without needing extensive data processing facilities. Furthermore, by calibrating the actual potential value of the high-pass filter, in each IDDT cycle a correct DUT will on the associated IDDT sample instant produce a substantially uniform voltage value. This in turn allows executing "real time comparison" by the digital tester. In practice, such usage saves much time, because no inappropriate computing load needs anymore to be impressed on the all-digital tester. Note that the tester does no longer need to be a mixed-signal tester that would have to accommodate handling both digital and analog signals. In fact, the circuit under test is usually digital, and the earlier measurement practice would also need processing of analog voltages.

SUMMARY TO THE INVENTION

In consequence, amongst other things, it is an object of the present invention to allow an integratable, straightforward, low-cost and reliable solution for application of the IDDT methodology to ever more compact digital CMOS circuitry.

Now therefore, according to one of its aspects the invention is characterized by having a current measuring circuit of the transient-current tester implemented in integrated circuit technology as a high-pass filter. The invention may be useful for analog circuits or circuit parts, or for other technology than CMOS or even MOS.

The invention also relates to an integrated circuit item for effecting the above interfacing between the digital tester and the circuit proper under test.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
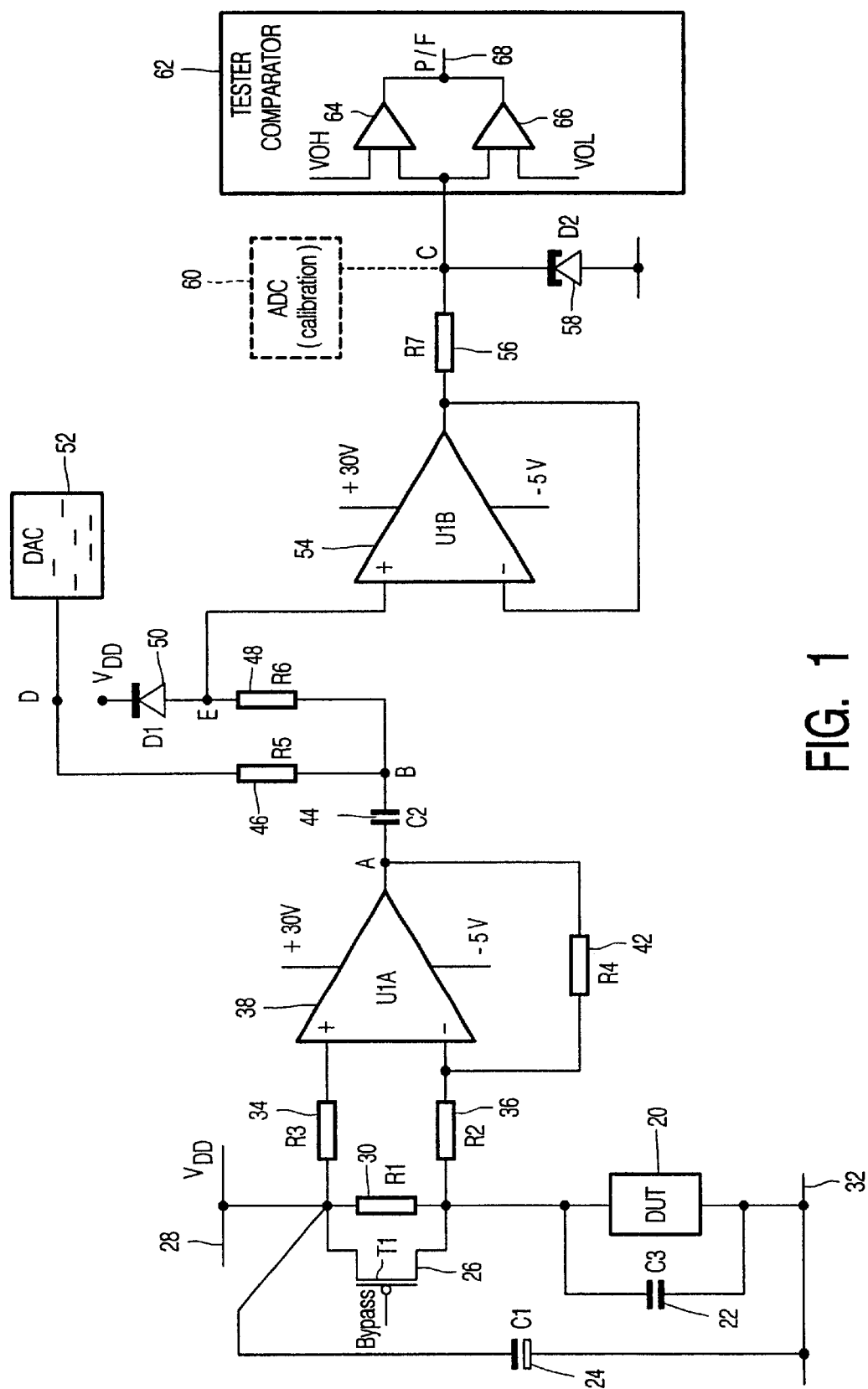
FIG. 1, an IDDT monitor with offset capability.

FIG. 1 represents an IDDT monitor provided with dynamic offset capability, that allows to impart a calibration voltage to each voltage or vector. As shown, the following items are present: device under test 20, DUT decoupling capacitor 22, electrolytic capacitor 24, controlled transistor bypass 26, VDD power line 28, series resistor 30, ground or VSS line 32, input resistors 34, 36, high-slew-rate and large-gain amplifier 38 that has an importantly unsymmetric power supply at +30 and −5 volts, respectively, feedback resistor 42, differentiating capacitor 44 with resistor 46, series resistor 48, protective clamping Zener diode 50, converter 52, high-slew-rate and large-gain retrocoupled amplifier 54 with the same unsymmetric power supply, series resistor 56 and Zener diode 58. Amplifier 54 operates as a buffer stage between the circuit under test and the measuring circuitry at the output. The Figure furthermore contains a few items that may either be executed in separate hardware or be co-integrated with the remainder of the IDDT monitor, to wit, tester comparator 62 with comparator elements 64 and 66, and signal output line 68. The unsymmetric powering enhancing the attainable output signal level; zenering protects against overload.

In the setup, an ADC 60 element has been shown for reading the response of a golden device, but may be left out during continual measurements on standard devices; as a compromise, it may be implemented a few times on a many-device integrated circuit wafer; and has therefore been represented in an interrupted manner. The calibration voltage will be equal to the opposite golden device voltage plus an offset value that may be in the range of 2.5 volts, or the like. In this case, the monitor output voltage will at all IDDT sampling instants be about 2.5 volts, so that it is possible to use the tester comparators to compare against a certain VOL and VOH on the fly, without necessitating extensive data processing. The comparators may, if preferred, constitute part of the monitor and be realized on the chip. Note that a time constant of R5*C2 is necessary for charging capacitor C2 to this calibration voltage. Furthermore, DAC element 52 is necessary to program the calibration voltage per IDDT cycle, to point D of the arrangement.

Figure 2:
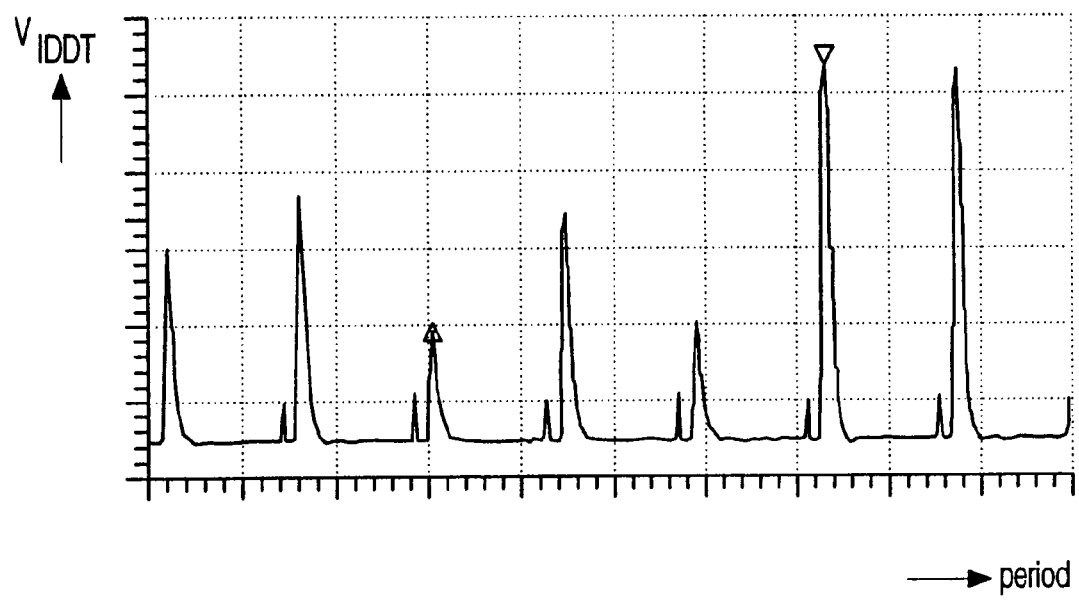
FIG. 2, the signal on point A in FIG. 1.

FIG. 2 represents part of the signal on point A in FIG. 1 as pertaining to seven successive periods of the control current pulses. Because the IDDT comparison is made against VDD, in this case 2.5 volts, the DC level also equals this VDD level.

Figure 3:
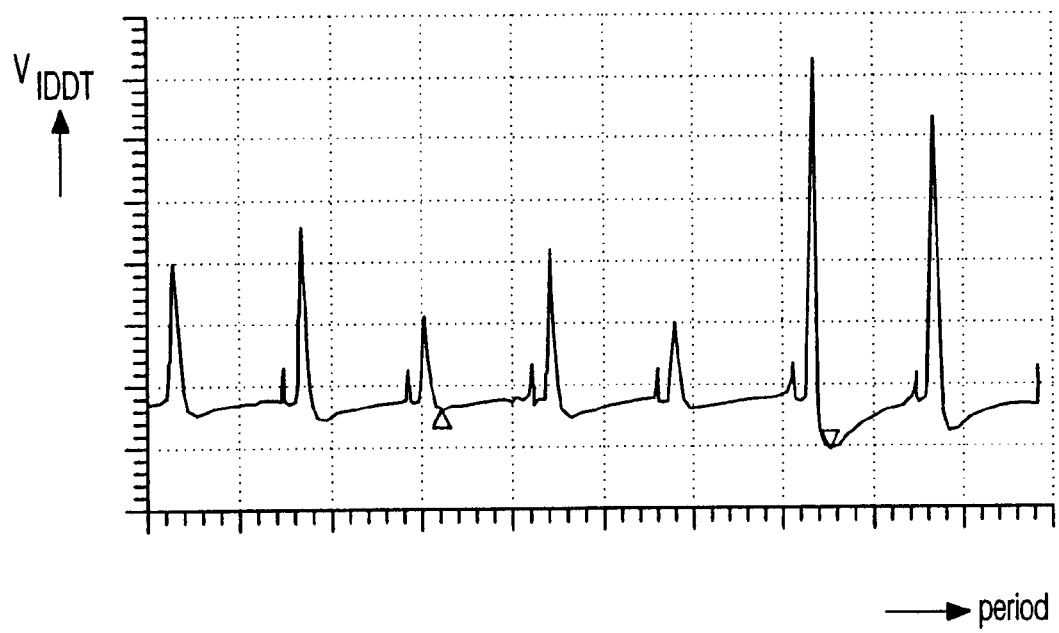
FIG. 3, the signal on point B of FIG. 1.

FIG. 3 represents the signal on point B of FIG. 1. The DC level equals the one on point D. If point D is connected to ground, a golden device signature being observed on point C, might cause Zener 58 to clamp the signal. Avoiding this possible cause of faulty measurements is done by programming this point on 1 volt or the like, causing a visible differentiated undershoot in the Figure.

Figure 4:
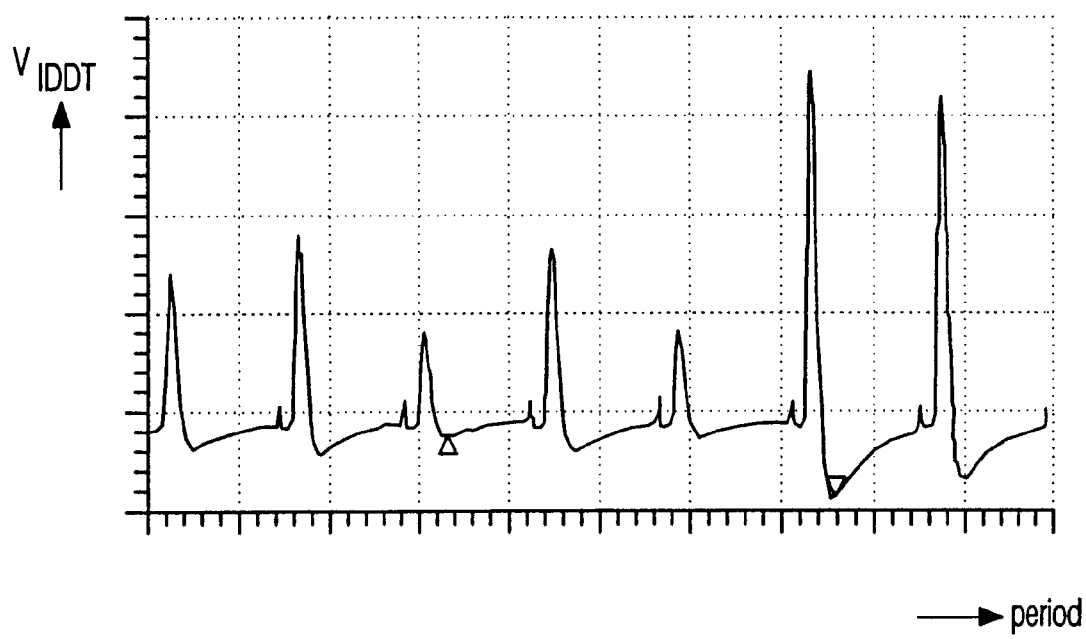
FIG. 4, the signal on point E of FIG. 1.

FIG. 4 represents the signal on point E of FIG. 1. In case of very high peak currents, much power will be dissipated in both amplifier stages. Because we will achieve a large gain, we cannot avoid the power consumption in the first stage. However, in the second stage we are only interested in the information of the undershoot signal. D1 will clamp the signal on point E to VDD−0.3 V, as the Schottky voltage.

Figure 5:
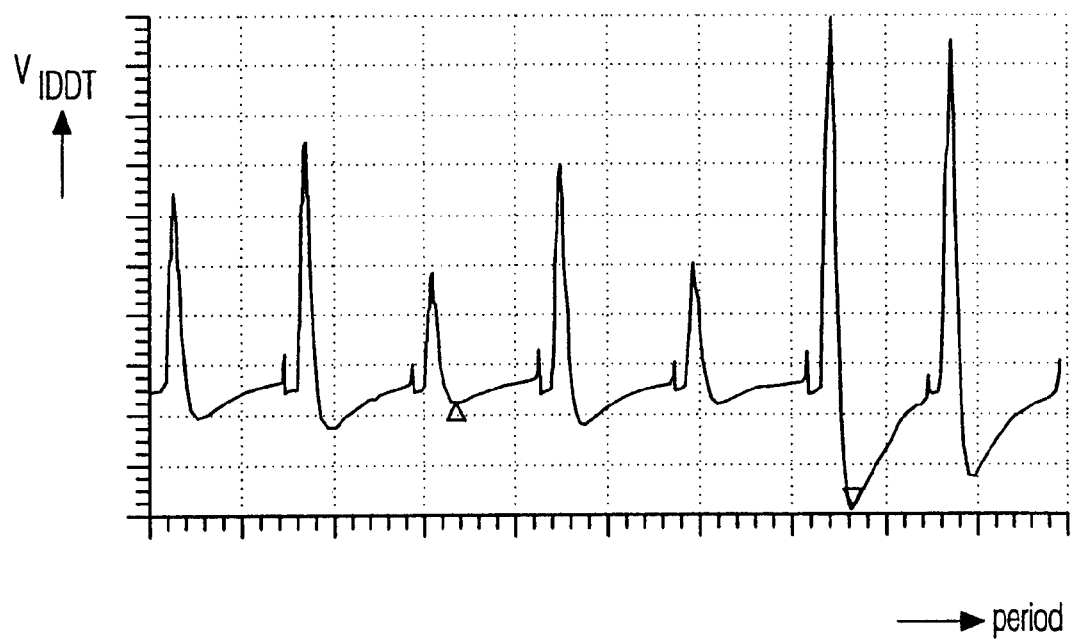
FIG. 5, the signal on point C of FIG. 1.

FIG. 5 represents the signal in point C of FIG. 1, which is the output of the IDDT monitor. The level swing on this point depends on the Zener diode D2 which is used. In our case we used a 6.3 V Zener, so that the maximum level is clamped at 6.3 V and the minimum value is limited to −0.7 V. Because we are only interested in the lowest point of the waveform, clamping of the peaks to 6.3 V is acceptable. However clamping to −0.7 V disturbs the IDDT measurement. As already outlined before, we can adjust the DC level by changing the level on point D. If the lowest point of the waveform is shifted to 3V, this would be the middle of the Zener swing. Unfortunately, the accuracy of the conversion will be less if a large voltage need to be supplied. For this reason an offset voltage on point D of 1V was programmed. Note that without buffer 54, equipment connected to point C should have a high input impedance, otherwise the output signal will be influenced by R7 and by the input resistance of the connected instrument. During the acquisition of the golden device data, the voltage on point D is a DC signal. The IDDT measurement points ("dips") have different values, so that the tester comparators cannot be used. In fact, the voltages VOL and VOH cannot be changed on-the-fly.

Figure 6:
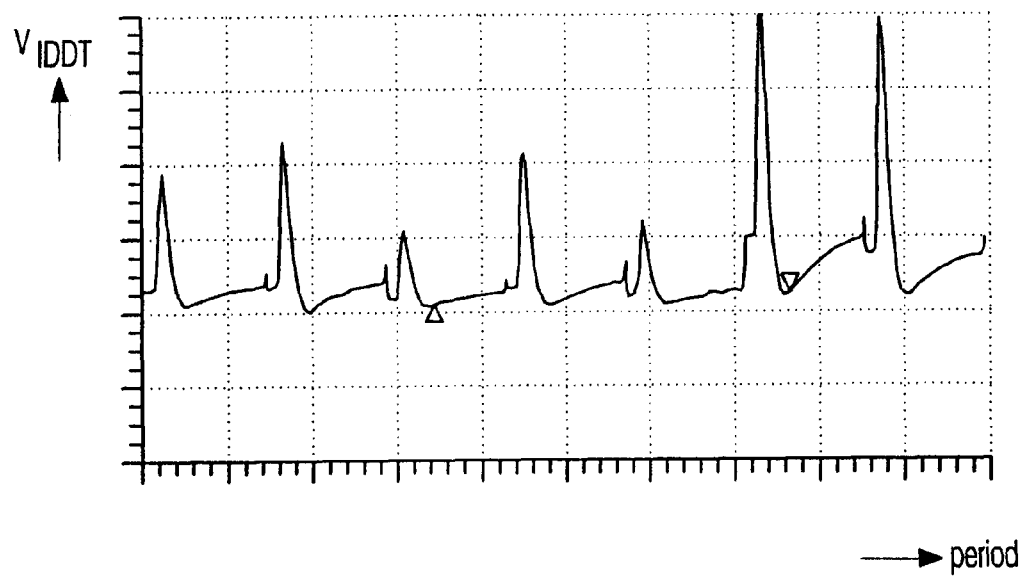
FIG. 6, the signal on point C, with a calibration voltage on point D.

FIG. 6 represents the signal on point C of FIG. 1, with a "calibration" voltage on point D, calibrated according to:

Voltage (D)=−(golden device levels)+offset voltage.

In the beginning of each IDDT cycle a "calibration level" is programmed to point D by using the DAC.

It takes about R5*C2, in our case about 2 microseconds, before C2 is charged to this value. As can be seen in the figure, all the IDDT observation points are corrected such, that the IDDT monitor output level of each IDDT cycle is the same. For creating the golden device calibration file, a few points are relevant. The digitizer or ADC trigger is adjusted for sampling the lowest point of the transient waveform. All values must be >−0.7 V, to avoid clamping of the Zener diode. In this case the DC-offset voltage on point D needs to be increased during the calibration. The average value of several golden devices may be used.

With this new method, it is possible to perform an IDDT test without data processing, by using the tester comparators. The following pins need to be added to the configuration file:

Trigger pin for ADC
Trigger pin for DAC
IDDT observe pin
8 DAC input pins

It is be possible to use one trigger pin instead of two, by triggering the DAC on the leading edge, and triggering the digitizer on the falling edge of the trigger pin. Continue the adjustment procedure with:

Program the expected data of the IDDT pin to "i" (intermediate level) on the IDDT cycles, and to "X" on the remaining scan vectors.
Mask all the other data output pins
Program IDDT VOL to −1000 mV
Program IDDT VOH to 5000 mV
Measure maximum VOL by performing a VOL global search on one or more golden devices
Measure minimum VOH by performing a VOH global search on one or more golden devices
Set IDDT levels to VOLmax minus an extra safety margin, VOHmin plus an extra safety margin
Perform sevel error count tests on several golden devices and verify that all tests passes.

Figure 7:
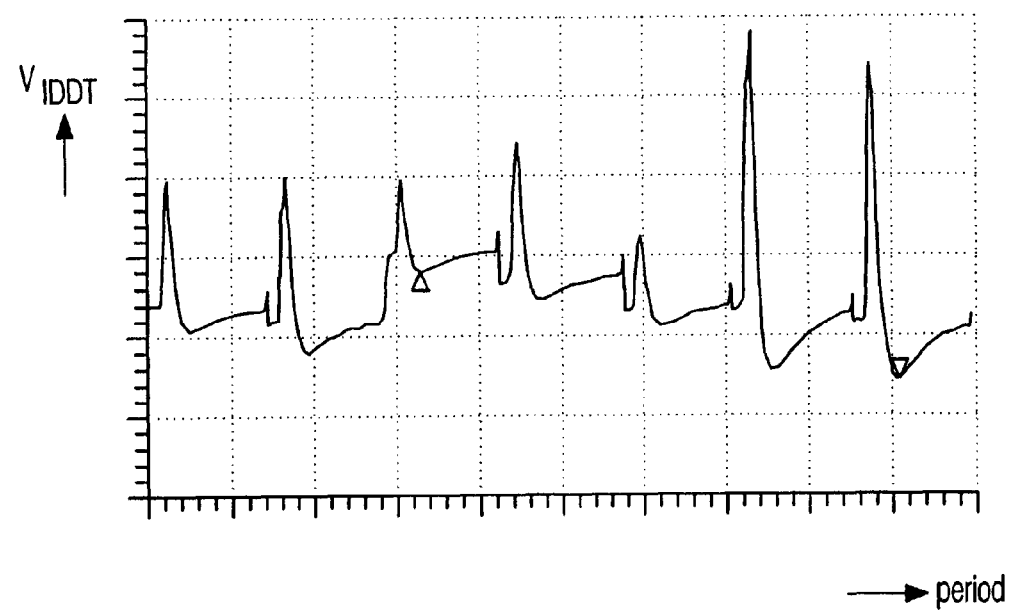
FIG. 7, ditto as applied on a faulty device.

FIG. 7 corresponds to FIG. 6, but applied to a malfunctioning device. As can be seen, the minimums of the waveforms are not on an equal level and will be outside the expected VOL and VOH IDDT threshold range, resulting in a faulty IDDT test.

An IDDT test may be implemented on a purely digital tester if an IDDT interface chip is used, or rather an IDDT monitor plus ADC/DAC combination. The interface chip between tester and DUT must contain at least the functionality of the IDDT monitor of FIG. 1. Digitizing may be done by an ADC. The calibration data measured with the ADC may be stored in the tester memory. During the IDDT test, a calibration voltage per IDDT cycle need to be supplied to the IDDT monitor to adjust all IDDT monitor output samples to one level. This can be achieved by supplying the stored ADC bits to the DAC. The DAC output voltage need to be subtracted from a certain DC level with a summing amplifier. This method can result in a significant test time reduction, because no IDDT comparison between DUT and golden device needs to be performed in software. Digital test systems are generally inexpensive compared to mixed signal handlers and normally donot have fast local processors to perform these calculations causing the workstation calculations to be much slower.

Figure 8:
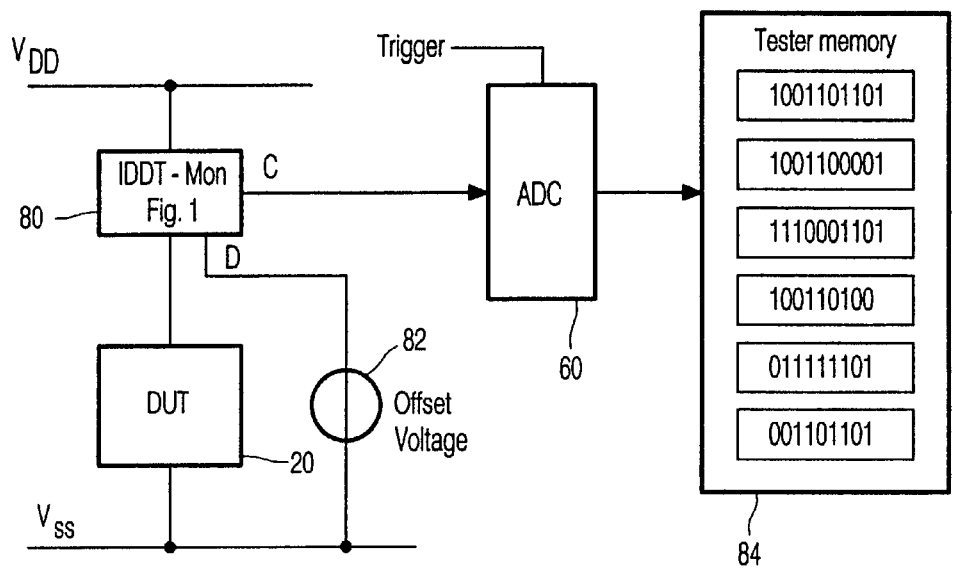
FIG. 8, the downloading of golden device data into a tester memory.

In this respect, FIG. 8 shows the downloading of golden device data into a tester memory. In particular, the following items have been represented: Device under test 20, IDDT monitor 80 that generally corresponds to circuit elements shown in FIG. 1, Offset voltage generator 82, ADC 60 with trigger input and tester memory 84, with the various appropriate bit patterns. Also, nodes C, D have been indicated. For simplicity, various supporting elements of FIG. 1 have been omitted.

Figure 9:
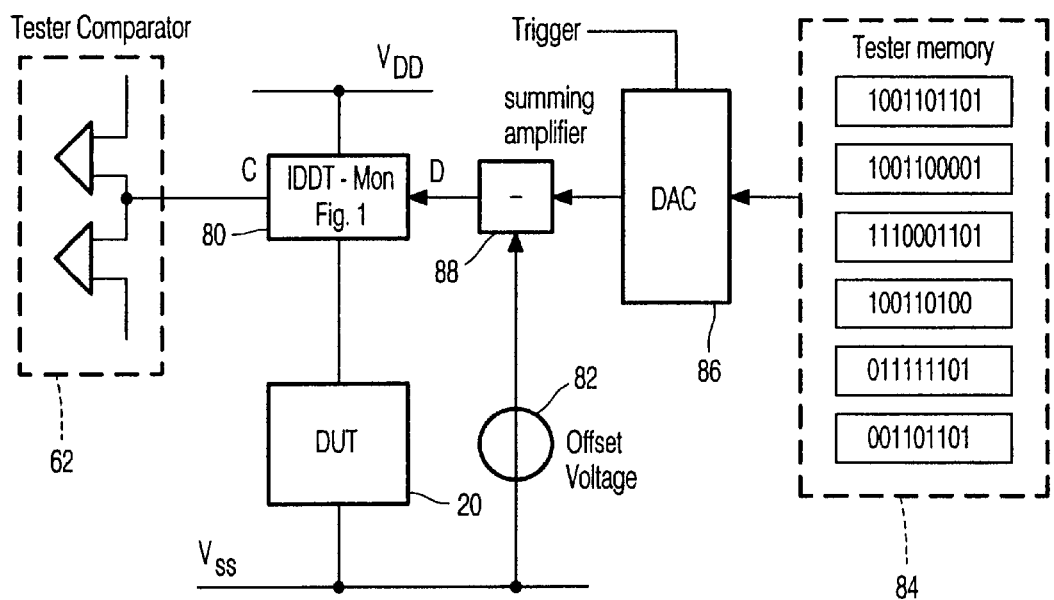
FIG. 9, IDDT calibration through using an ADC device.

FIG. 9 shows IDDT calibration through using an ADC. Different items from FIG. 8 are the following: Tester comparator 62, DAC converter 86 and amplifier 86 that executes a subtraction. The operation is straightforward.

Figure 10:
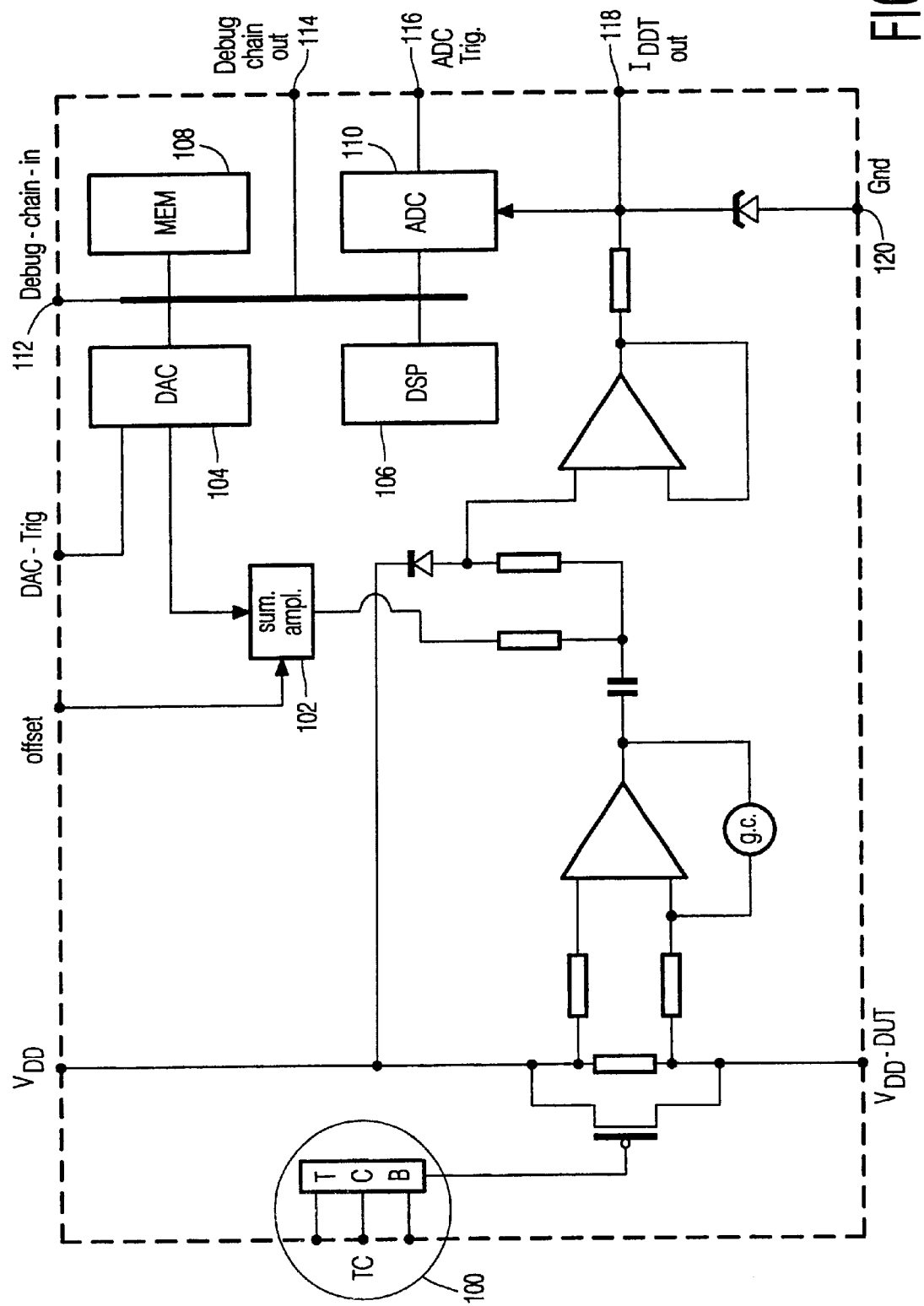
FIG. 10, an embodiment of an IDDT mixed-signal interface chip.

FIG. 10 shows an embodiment of an IDDT mixed signal interface chip. Items repeated from FIG. 1 have been left unlabeled. Furthermore, the setup contains Test Control pins 100, that may drive the following modes:
select required gain
acquire golden device data
averaging data of golden devices IDDT measuring mode
IDDT monitor-transparent mode.

Furthermore, DAC 104, Digital Signal Processor 106, Memory 108, and ADC 110 are evident. Pins VDD, VDD-DUT, Offset, DAC Trigger are evident. Further pins are Debug Chain in 112, Debug chain out 114, ADC trigger 116, IDDT out 118 and Ground 120. Functions are evident from the PIN names. As required, DSP and MEM may be left out from a lower level circuit.

What is claimed is:

1. An arrangement for transient-current testing of a device-under-test, comprising:
    a current measuring circuit that is configured to provide an input undershoot voltage corresponding to each of a series of current pulses from the device-under-test,
    a calibration circuit that is configured to provide a calibration voltage corresponding to each of the series of current pulses, and
    a summer, operably coupled to the current measuring circuit and the calibration circuit, that is configured to provide an output undershoot voltage corresponding to a combination of the input undershoot voltage and the calibration voltage for each of the series of current pulses,
    wherein
        the calibration voltage corresponding to each of the series of current pulse is designed to provide a substantially uniform output undershoot voltage when the device-under-test is functioning according to its specification.

2. An arrangement as claimed in claim 1, further comprising
    a high-slew-rate differentiating differential amplifier arranged between a signaling output of the device under test and an input of said current measuring circuit.

3. An arrangement as claimed in claim 2, wherein
    the differentiating differential amplifier includes an unsymmetric power supply.

4. An arrangement as claimed in claim 3, wherein
    the differentiating differential amplifier has a clamping facility for clamping excessive output voltage pulses thereof caused by the unsymmetric power supply.

5. An arrangement as claimed in claim 2, furthermore comprising
    a buffer stage led by an output of the differentiating differential amplifier, that is configured to provide an input of an all-digital tester comparator, via an oscillation damper resistor.

6. An arrangement as claimed in claim 1, wherein
    the device-under-test contains CMOS technology.

7. An arrangement as claimed in claim 1, wherein
    the device-under-test contains digital circuitry.

8. An arrangement as claimed in claim 1, further including
    a damping electrolytic capacitor, operably coupled between respective electric power connections to the devil under test.

9. An arrangement as claimed in claim 1, furthermore comprising
    a low ohmic and specifically activatable bypass for bridging a measuring output resistor of the device under test.

10. An integrated circuit comprising:
    a current measuring circuit that is configured to measure an undershoot voltage for each of a series of current pulses controlled in a circuit under test, and
    a digital to analog converter, operably coupled to the current measuring circuit that is configured to provide a calibration voltage that is combined with each undershoot voltage of the series of current pulses, so as to provide in each cycle of the series of current pulses a substantially uniform undershoot voltage.

11. An integrated circuit as claimed in claim 10, further comprising
    an analog to digital converter that is configured to determine one or more calibration measures, corresponding to a plurality of output values at an output of the current measuring circuit while a properly functioning device is used as the circuit under test, and
    wherein
        the digital to analog converter is configured to provide the offset voltage to a subsequent circuit under test based on the one or more calibration measures.

12. An integrated circuit as claimed in claim 11, wherein
    the one or more calibration measures are based on an average of the plurality of output values.

* * * * *